United States Patent
Kroeger et al.

(10) Patent No.: US 6,385,835 B1
(45) Date of Patent: May 14, 2002

(54) APPARATUS FOR FABRICATING CONTINUOUS LENGTHS OF SUPERCONDUCTOR

(75) Inventors: Donald M. Kroeger, Knoxville; Frederick A. List, III, Andersonville, both of TN (US)

(73) Assignee: UT Battelle, Oak Ridge, TN (US)

( * ) Notice: Subject to any disclaimer, the term of this patent is extended or adjusted under 35 U.S.C. 154(b) by 0 days.

(21) Appl. No.: 08/979,243

(22) Filed: Nov. 26, 1997

Related U.S. Application Data

(62) Division of application No. 08/684,922, filed on Jul. 22, 1996, now Pat. No. 5,830,828, which is a continuation of application No. 08/304,020, filed on Sep. 9, 1994, now abandoned.

(51) Int. Cl.$^7$ .............................................. B21B 15/00
(52) U.S. Cl. ......................... 29/335; 118/308; 228/190
(58) Field of Search ................. 505/813, 826, 505/432, 434; 156/276, 583.1; 228/190, 235.1, 235.2, 235.3; 174/125.1; 118/308; 29/335, 599; 427/62

(56) References Cited

U.S. PATENT DOCUMENTS

| | | | |
|---|---|---|---|
| 4,921,833 A | * 5/1990 | Takano | 29/599 |
| 4,992,126 A | * 2/1991 | Door | 156/276 |
| 5,002,928 A | * 3/1991 | Fukui et al. | 505/1 |
| 5,034,372 A | 7/1991 | Matsumo et al. | |
| 5,047,741 A | * 9/1991 | Laskaris | 174/125.1 |
| 5,059,582 A | 10/1991 | Chung | |
| 5,075,286 A | * 12/1991 | Powell et al. | 29/599 |
| 5,081,102 A | 1/1992 | Gay et al. | |
| 5,104,849 A | * 4/1992 | Shiga et al. | 505/1 |
| 5,151,406 A | 9/1992 | Sawada et al. | |
| 5,164,360 A | * 11/1992 | Woolf et al. | 505/1 |
| 5,177,055 A | 1/1993 | Kinsman et al. | |
| 5,180,707 A | 1/1993 | Gao et al. | |
| 5,187,149 A | 2/1993 | Jin et al. | |
| 5,202,305 A | * 4/1993 | Watanabe et al. | 505/1 |
| 5,208,215 A | 5/1993 | Chen et al. | |
| 5,252,550 A | * 10/1993 | Yamauchi et al. | 174/125.1 |
| 5,312,804 A | * 5/1994 | Petitbon et al. | 505/424 |
| 5,416,063 A | * 5/1995 | Gross et al. | 505/434 |

FOREIGN PATENT DOCUMENTS

| | | |
|---|---|---|
| JP | 2-207420 | 8/1990 |
| JP | 4-342911 | 11/1992 |
| JP | 6-12929 | 1/1994 |
| WO | 89/02871 | 4/1989 |
| WO | 90/14307 | 11/1990 |

OTHER PUBLICATIONS

Ochiai, et al Fracture Behaviour and its Relation to Critical Current of Silver–Sheathed $Ba_2YCu_3O_{7-x}$ Superconducting Composite Wires and Tapes *Journal of Materials Science* 25; (1990) p. 3467.

* cited by examiner

*Primary Examiner*—Daniel W. Howell
(74) *Attorney, Agent, or Firm*—Joseph A. Marasco

(57) ABSTRACT

A process and apparatus for manufacturing a superconductor. The process is accomplished by depositing a superconductor precursor powder on a continuous length of a first substrate ribbon, overlaying a continuous length of a second substrate ribbon on said first substrate ribbon, and applying sufficient pressure to form a bound layered superconductor comprising a layer of said superconducting precursor powder between said first substrate ribbon and said second substrates ribbon. The layered superconductor is then heat treated to establish the superconducting phase of said superconductor precursor powder.

3 Claims, 1 Drawing Sheet

APPARATUS FOR FABRICATING CONTINUOUS LENGTHS OF SUPERCONDUCTOR

This application is a divisional of U.S. Ser. No. 08/684,922 now U.S. Pat. No. 5,830,828 filed on Jul. 22, 1996 which is a continuation of the parent application U.S. Ser. No. 08/304,020 filed on Sep. 9, 1994 (now abandoned).

This invention was made with Government support under DE-AC05-840R21400 awarded by the U.S. Department of Energy to Martin Marietta Energy Systems, Inc., and the Government has certain rights in this invention.

FIELD OF THE INVENTION

The invention relates to the fabrication of superconductors. More particularly, the invention relates to the fabrication of continuous lengths of superconductors having at least one superconducting oxide layer between metallic substrates.

BACKGROUND OF THE INVENTION

The quality of the interface layer between a superconducting material and a metallic substrate is very important in superconducting oxide/metal conductors. The densest and most highly textured superconducting oxide is generally at the interface between the superconducting oxide and the metallic substrate. Consequently, the interface must be smooth, and in tape geometries, planar.

Preparation of long lengths of superconductor is especially difficult. The powder-in-tube method has been previously utilized with some success. Additionally, recent processes include the utilization of multilayered foils coated with superconductor precursor powders that are sealed in a box and unidirectionally rolled. These, and other, methods for preparing long lengths of a super conductor result in interfaces between the superconducting material and the substrate that are less than ideal.

Specifically, fabrication processes such as the powder-in-tube method produce long conductor lengths by starting with large billets containing oxide cores several millimeters or more in diameter. Dimensional uniformity of the core and a smooth interface are difficult to maintain during the large reduction in cross section necessary for fabrication of long thin ribbon conductors.

U.S. Pat. No. 5,034,272 to Matsuno et al. and U.S. Pat. No. 5,002,928 to Fukio et al. describe methods for depositing oxide substances on substrates to form superconductors. Both methods include the deposition of atomized superconductive oxide substances onto a substrate.

Additionally, Shiga et al. (U.S. Pat. No. 5,104,849) describes the manufacture of an oxide superconductor wire. The wire is manufactured by applying oxide powder to cylindrical stabilizing metal materials having differing diameters. The coated metal materials are then concentrically arranged. The wire is rolled, before heating the same to produce the oxide superconducting wire. Other superconductors and methods for manufacturing superconductors are disclosed in U.S. Pat. No. 5,208,215 to Chen et al., U.S. Pat. No. 5,187,149 to Jin et al., U.S. Pat. No. 5,164,360 to Woolf et al., U.S. Pat. No. 5,151,406 to Sawanda et al., and U.S. Pat. No. 5,059,582 to Chung.

The prior art discussed above neither discloses nor suggests the present process or apparatus for manufacturing continuous strips of superconducting materials having a smooth interface between the superconducting material and the substrate. Additionally, the prior art does not disclose or suggest a superconductor manufactured by the present process. The present process reduces the deformation normally resulting from the rolling and drawing utilized by the prior art methods, thus yielding improved texture and less roughness at the interface between the substrate and the superconducting film.

SUMMARY OF THE INVENTION

An object of the invention is to provide long lengths of superconductor and a process for preparing the same.

Another object of the invention is to provide a method for the preparation of long lengths of superconductor having a superior interface between the superconducting material and the metal substrate.

A further object of the invention is to provide a process and apparatus for manufacturing long lengths of superconductor having very good dimensional stability.

These and other objects of the present invention are achieved by the present process for manufacturing a superconductor. The process is accomplished by depositing a superconductor precursor powder on a continuous length of a first substrate ribbon, overlaying a continuous length of a second substrate ribbon on said first substrate ribbon, and applying sufficient pressure to form a bound layered superconductor comprising a layer of said superconducting precursor powder between said first substrate ribbon and said second substrates ribbon. The layered superconductor is then heat treated to establish the superconducting phase of said superconductor precursor powder.

The limited fabrication required by the present invention results in improved homogeneity. Specifically, the present invention only relies upon a two fold reduction in the thickness of the superconductor during the fabrication thereof. The homogeniety produced by the present invention results in a superconductor having better electrical characteristics than those demonstrated by prior art superconductors. Additionally, superconductors made in accordance with the present invention demonstrate an absence of non-superconducting materials at the interface and improved dimensional stability.

Other objects, advantages and salient features of the invention will become apparent from the following detailed description which, taken in conjunction with the annexed drawings, discloses the preferred embodiment of the subject invention.

DETAILED DESCRIPTION OF THE INVENTION

Figure 1:
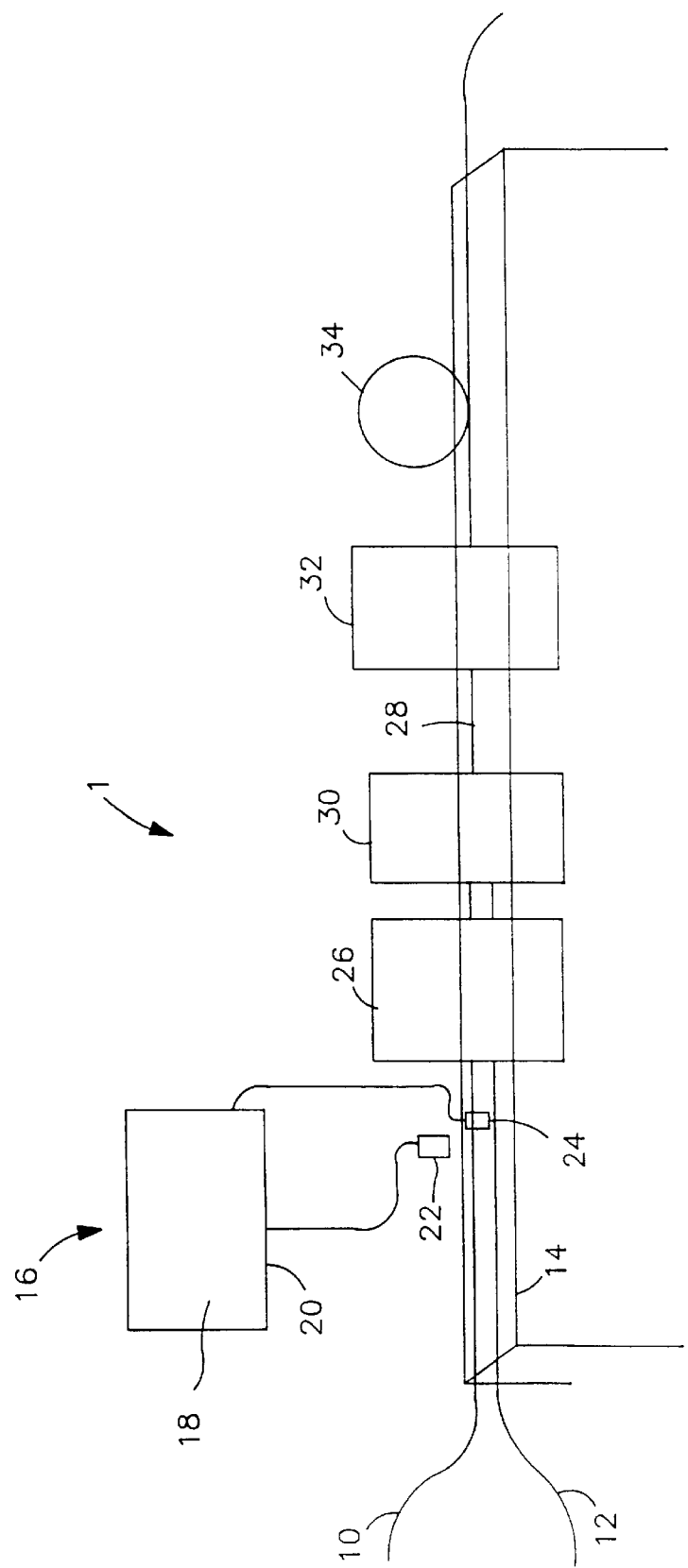
FIG. 1 is a schematic representation of the subject invention.

The present invention provides a process for fabricating continuous lengths of superconductor. The superconductors made in accordance with the subject invention are preferably composed of one or more thin, high-temperature superconducting layers between metallic substrates.

With reference to FIG. 1, an apparatus 1 for the continuous fabrication of long lengths of superconductor is schematically illustrated. A first metallic substrate ribbon 10 is fed through apparatus 1, while a second separate metallic substrate ribbon 12 is simultaneously fed through the apparatus 1 at the same speed as the first ribbon 10. The substrate ribbons are long continuous strands. The ribbons are preferably silver or silver alloys (e.g., silver 90–95%/palladium 5–10%), although other materials may be used within the spirit of the invention. The ribbons may be supplied by any conventional mechanism, for example, conveyers 14, used for continuously feeding long strands of materials.

The first ribbon 10 and the second ribbon 12 are simultaneously fed past a structure 16 for depositing a superconductor precursor powder 18, preferably the bismuth-based, thallium-based, or yttrium-based families of high temperature oxide superconductor precursor powders, onto the respective ribbons. The precursor powder 18 may be deposited onto the respective ribbons by spray drying or it may be deposited by direct brush application of a powder slurry in a volatile liquid such as butanol. In the preferred embodiment, a suspension of the aerosol precursor powder 18 is stored within a pump assembly 20. Conventional mechanisms are used to force the precursor powder 18 from the pump assembly 20.

The superconductor precursor powder 18 is forced through the pump assembly 20 to a pair of spray nozzles 22, 24. Preferably, the spray nozzles 22, 24 operate at 120 kHz to produce 18 um diameter droplets of the superconductor precursor powder 18. The droplets are deposited on the first and second metallic substrate ribbons 10, 12 as they pass below the respective spray nozzles 22, 24.

The superconductor precursor powder 18 is applied to the substrate ribbons 10, 12 to permit the formation of a continuous coating of the superconducting material thereon after fabrication of the superconductor is completed. Preferably, the resulting superconductor should have at least a 10 micron layer of the superconducting material after fabrication is completed.

The use of suspensions of aerosol superconductor precursor powder 18 has at least two advantages. First, the high homogeneity and small particle size of aerosol powders permits the preparation of thin coatings which are dimensionally and compositionally uniform. Additionally, high reactivity aerosol powders lead to shorter heat treatment times which permit continuous rather than batch fabrication processing.

After the precursor powder 18 is deposited on the first and second ribbons 10, 12, the ribbons move continuously into a low temperature furnace 26 where the precursor powder 18 is dried and surface contaminants are removed from the precursor powder 18. During this step the precursor powder will bond to respective substrate ribbons.

Once the superconductor precursor powder 18 has been appropriately deposited on the respective first and second metallic substrate ribbons 10, 12, and the ribbons have been appropriately heated, the first ribbon 10 and the second ribbon 12 are overlaid to form a mechanical bound layered superconductor 28 composed of a superconducting layer encased within the first and second metallic substrate ribbons. Formation of the layered superconductor 28 is achieved by rolling or pressing the layers with sufficient force to create a bound superconducting layer 28. The rolling or pressing is done by conventional structures 30. Preferably, the edges of the first substrate ribbon 10 and the second substrate ribbon 12 are left bare during the deposition step to facilitate the formation of the layered superconductor 28. As a result, the layers of the layered superconductor 28 are bound together by both substrate to substrate bonding and powder to powder bonding.

If desirable, the edges of the layered superconductor 28 can be folded, or otherwise dressed, to provide a good mechanical bond and to prevent free passage of air borne contaminants.

Finally, the layered superconductor 28 is heat treated to create the desired superconductor. Specifically, the heat treatment converts the superconductor precursor powder to its superconducting phase. The layered superconductor 28 is heat treated by passing the same through an appropriate furnace 32. After the layered superconductor 28 is heat treated, the process is completed by rolling 34 the layered superconductor 28 to form a highly textured superconducting core.

The preferred embodiment discussed above, permits the continuous fabrication of long lengths superconductor. That is, feeding, depositing, heating, rolling/pressing, heating, and rolling occur without the need to cut the continuous strands of the first and second ribbons 10, 12, until the process is completed. Each of these variables is also considered when determining the processing rate for the superconductor.

If, however, the heat treatment step requires too much time to make continuous fabrication of the superconductor feasible, the layered superconductor can be formed in pieces and wound about mandrels. The wound layered superconductor are then heat treated by convention methods to convert the superconductor precursor powder to its superconducting phases. By way of this method 1 kilometer lengths of the superconductor can be manufactured.

In alternate embodiments, the second ribbon can be bare. In such an embodiment, the bare second ribbon is combined with the first coated ribbon in the manner discussed above to form a substrate—superconducting powder—substrate layered superconductor. Whether the second ribbon is coated or bare, the edges of the superconductor can be folded or otherwise dressed to provide a good mechanical bond and to prevent free passage of air borne contaminants. Additionally, multi-layer geometries can be fabricated by co-rolling several coated ribbons and superconductors having a single substrate ribbon are possible.

The process disclosed above results in a smooth interface between the superconducting material and the metal substrate. Metallographic examinations were made of polished cross sections comparing a superconducting oxide/metal superconductor made in accordance with the subject invention and a superconducting oxide/metal superconductor made in accordance with a powder-in-tube method. The superconductor made in accordance with the present invention had a smooth interface between the superconducting material and the substrate when compared to the superconductor made in accordance with the powder-in-tube method. This results in a superconductor having exceptional electrical characteristics, an absence of non-superconducting materials at the interface, and better dimensional stability.

Having described the preferred embodiment of the present invention, it will appear to those of ordinary skill in the art that various modifications may be made to the disclosed embodiment, and that such modifications are intended to be within the scope of the present invention.

What is claimed is:

1. An apparatus for manufacturing a superconductor comprising:

means for depositing a superconductor precursor powder on a continuous length of a first substrate ribbon;

means for overlaying a continuous length of a second substrate ribbon on said first substrate ribbon;

means for applying sufficient pressure to form a bound layered superconductor comprising a layer of said superconducting precursor powder between said first substrate ribbon and said second substrates ribbon; and means for heat treating said layered superconductor to establish the superconducting phase of said superconductor precursor powder.

2. The apparatus according to claim 1, further comprising means for depositing a superconductor precursor powder on said second substrate ribbon before the formation of said layered superconductor.

3. The apparatus according to claim 1, further comprising means for heating said coated first substrate ribbon prior to forming said layered superconductor.

* * * * *